United States Patent [19]

Barber

[11] Patent Number: 5,801,072
[45] Date of Patent: Sep. 1, 1998

[54] METHOD OF PACKAGING INTEGRATED CIRCUITS

[75] Inventor: Ivor G. Barber, San Jose, Calif.

[73] Assignee: LSI Logic Corporation, Milpitas, Calif.

[21] Appl. No.: 615,388

[22] Filed: Mar. 14, 1996

[51] Int. Cl.$^6$ .................................................. H01L 21/44
[52] U.S. Cl. ........................................... 438/107; 438/106
[58] Field of Search ..................................... 437/205, 206, 437/209, 211, 214, 215, 217, 219, 220; 438/106, 107, 108, 109

[56] References Cited

U.S. PATENT DOCUMENTS

| | | | |
|---|---|---|---|
| 5,071,787 | 12/1991 | Mori et al. | 437/209 |
| 5,147,815 | 9/1992 | Casto | 437/206 |
| 5,227,338 | 7/1993 | Kryzaniwsky | 437/209 |
| 5,340,771 | 8/1994 | Rostoker | 437/209 |
| 5,366,933 | 11/1994 | Golwalkar et.al | 437/209 |
| 5,468,681 | 11/1995 | Pasch | 438/108 |
| 5,504,035 | 4/1996 | Rostoker et al. | 438/108 |
| 5,527,740 | 6/1996 | Golwalkar et al. | 437/206 |

*Primary Examiner*—Kevin Picardat
*Attorney, Agent, or Firm*—Luedeka, Neely & Graham P.C.

[57] ABSTRACT

A method of assembling flip chips in a package. Solder bumps are attached to a first flip chip and to a second flip chip. A package substrate having first and second opposing sides is provided, and the first flip chip is electrically connected to the first side of the package substrate using the solder bumps attached to the first flip chip. The second flip chip is also electrically connected to the second side of the package substrate using the solder bumps attached to the second flip chip. The position of the second flip chip is substantially opposed to and aligned with the position of the first flip chip. The first and second flip chips are under filled with a heat conductive epoxy. The first flip chip is encapsulated against the first side of the package substrate, and the second flip chip is encapsulated against the second side of the package substrate. Solder balls are attached to the first side of the package insert. By attaching the flip chips to opposite sides of the package substrate, balancing the structure of the overall package, bending stress is reduced due to the flip chips having similar thermal coefficients of expansion. Additional benefits include improved electrical performance, reduced weight, and reduced size of the packaged circuit.

14 Claims, 2 Drawing Sheets

Fig. 1
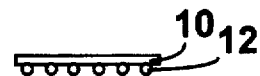
Fig. 2
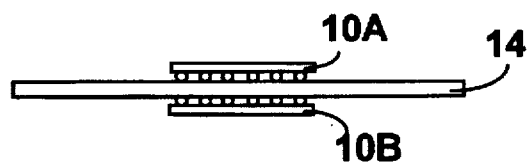
Fig. 3A
Fig. 3B
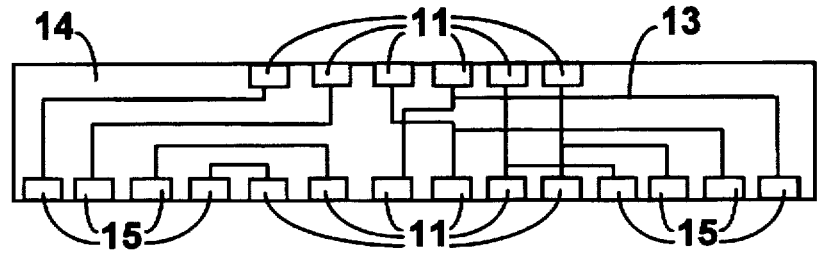
Fig. 4
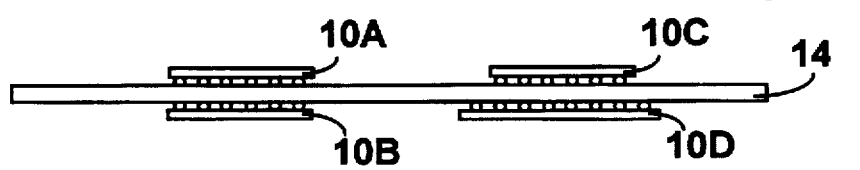
Fig. 5
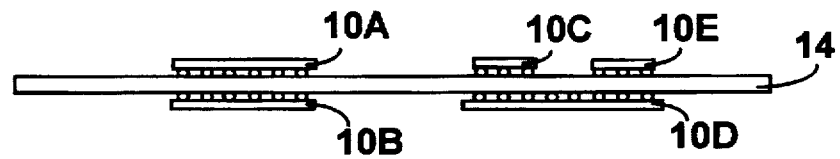

METHOD OF PACKAGING INTEGRATED CIRCUITS

FIELD OF THE INVENTION

This invention relates to the field of packaging integrated circuits. More particularly the invention relates to surface mount packaging for flip chip semiconductor devices.

BACKGROUND OF THE INVENTION

Integrated circuits are typically packaged before they are used with other components as parts of larger electronic systems. The packages provide electrical connections to the contact areas of the integrated circuit, and also provide protection for the fragile integrated circuit. Surface mount technology packages are especially preferred in manufacturing because they are designed to be attached directly to the circuit board in which the integrated circuit is to be used. Other package types are typically mounted through holes in the circuit board, and are thus more difficult to place. Further, the holes tend to inhibit signal routing on the printed circuit board. Thus a surface mount package typically provides reduced cost and greater design flexibility than other package types.

When a flip chip is packaged in a surface mount package, the flip chip is attached to a package substrate by means of small solder bumps. The package substrate is designed to be thin and lightweight, so as to reduce the size and weight of the overall package. Unfortunately, these design goals tend to make the package substrate relatively flexible, which can create problems.

One problem with the traditional method of assembling flip chips onto surface mount packages is that after the flip chip is attached to the package substrate, it is exposed to stress caused by the package substrate flexing during subsequent handling. These stresses may cause the flip chip to delaminate from the package substrate such that electrical connections between the flip chip and the substrate fail. Such stresses also tend to crack the flip chip mounted on the package substrate, which may cause it to fail during use.

Bending stresses may also be induced during use of the packaged flip chip. The flip chip creates heat when it is energized, which is localized in the area of the package where the flip chip resides. Because the package substrate tends to have a different thermal coefficient of expansion than the flip chip, stresses are induced between the flip chip and the substrate, which can lead to the cracking and delamination problems mentioned above.

Several methods have traditionally been used to overcome the problems associated with the flexibility of the package substrate. One method is to use thicker, or more rigid package substrates. However, this tends to result in larger, heavier packages, which reduces the benefits of a surface mount package. Supports, such as a plate mounted on the package substrate opposite the flip chip or a rigid ring mounted on the package substrate around the flip chip, have also been used to add rigidity to the package. However, these devices also result in a larger, heavier package.

What is needed, therefore, is a method of packaging integrated circuits which reduces the stress imparted to an integrated circuit from a flexible package substrate, and which does not add appreciably to the overall size and weight of the resulting package.

SUMMARY OF THE INVENTION

The above and other objects are met by a method of assembling a flip chip in a package. Solder bumps are attached to a first flip chip and to a second flip chip. A package substrate having first and second opposing sides and electrical connections between the first and second sides, is provided, and the first flip chip is electrically connected to the first side of the package substrate using the solder bumps attached to the first flip chip. The second flip chip is also electrically connected to the second side of the package substrate using the solder bumps attached to the second flip chip. The position of the second flip chip is substantially opposed to and aligned with the position of the first flip chip.

Several benefits are realized by attaching the integrated circuits to opposite sides of the package substrate. By balancing the structure of the overall package, bending stress is reduced. This is due to integrated circuits, having similar thermal coefficients of expansion, located on both sides of the package substrate, which reduces warping of the package substrate. Because warping is reduced, thinner package substrates may be used, allowing the overall package to be relatively smaller, lighter, and less expensive. In addition, by placing multiple integrated circuits on a package substrate, a higher package density is realized, reducing the number of packages required to hold a given number of integrated circuits. Further, by placing the integrated circuits in closer proximity one to another, the circuits are able to run at faster speeds.

Preferably, the first and second flip chips are under filled with a heat conductive epoxy. The first flip chip is encapsulated against the first side of the package substrate, and the second flip chip is encapsulated against the second side of the package substrate. Also preferably, solder balls are attached to the first side of the package insert.

BRIEF DESCRIPTION OF THE DRAWINGS

Further advantages of the invention will become apparent by reference to the detailed description of the invention when considered in conjunction with the following drawings, which are not to scale, and in which like reference numerals denote like elements throughout the several views, and wherein:

FIG. 1 is a cross-sectional view of a flip chip;

FIG. 2 is a cross-sectional view of a flip chip with solder bumps attached;

FIG. 3A is a cross-sectional view of a pair of flip chips mounted to a package substrate;

FIG. 3B is an enlarged cross-sectional view of a portion of a package substrate;

FIG. 4 is a cross-sectional view of two pair of flip chips mounted to a package substrate;

FIG. 5 is a cross-sectional view of an odd number of flip chips mounted to a package substrate;

DETAILED DESCRIPTION OF THE INVENTION

Figure 6:
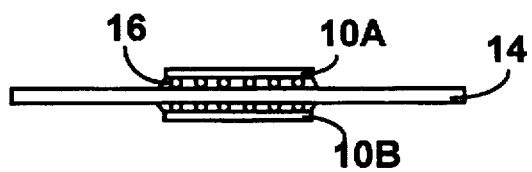
FIG. 6 is a cross-sectional view of a pair of flip chips which have been mounted to a package substrate and under filled.

Referring now to the drawings there is depicted in FIG. 1 an integrated circuit 10. The integrated circuit 10 could be, in various alternate embodiments, any one of a number of different types of semiconductor devices, but in a preferred embodiment is a flip chip. Solder bumps 12, depicted in FIG. 2, are attached to flip chip 10 by methods which are commonly known in the art. The solder bumps 12 are comprised of any of the materials commonly used in the art.

A pair of flip chips, 10A and 10E are then electrically connected to opposite sides of a package substrate 14, using the solder bumps 12, as depicted in FIG. 3A. The package substrate 14 may be formed of any one of a number of different materials commonly used in the art, such as, without limitation, circuit board, flex circuit, and ceramic, but in the preferred embodiment is formed of a thermoplastic resin.

The package substrate 14 has bonding pads 11 and electrical leads 13, depicted in FIG. 3B (which is an enlarged cross-sectional view of a portion of the package substrate 14), which are electrically connected to the solder bumps 12, and through which electrical connections are made between the flip chips 10 and other components. Some of the pads 11 on either side of the package substrate 14 may be electrically connected to each other by means of the electrical leads 13, while others of the pads 11 are independently wired. The electrical leads 13 are preferably ohmically connected to contact pads 15, the significance of which is described hereafter.

In this manner the two flip chips 10A and 10B can share common electrical leads 13, providing, for example, power, clock pulses, or ground to the flip chips 10A and 10B. When multiple flip chips 10 are wired in this manner, they may thus share common components such as decoupling chip capacitors. The close spacing of the flip chips 10, and the short, common wiring between them, allows for the combined circuit to be extremely fast, and provides improved conditions for complimentary, redundant, or supporting circuits. For example, if flip chip 10A is a microprocessor, then flip chip 10B could be a cache memory for the microprocessor.

The pair of flip chips 10A and 10B are placed so as to be on opposite sides of the package substrate 14 from each other, and so as to be substantially aligned at their peripheral edges one to another. However, if the flip chips 10C and 10D are of different sizes, as depicted in FIG. 4, then they are aligned so that their centers are substantially aligned. As is also depicted in FIG. 4, more than one pair of flip chips 10A–10B and 10C–10D may be attached to a single substrate.

As depicted in FIG. 5, an odd number of flip chips 10 may be electrically connected to package substrate 14. Flip chips 10C and 10E are aligned such that their combined center is substantially aligned to the center of larger flip chip 10D. If several flip chips, such as 10C and 10E, are sufficiently smaller than a larger flip chip 10D, then several smaller flip chips may be aligned opposite flip chip 10D.

The flip chips 10 are preferably divided between the two sides of the package substrate 14 such that the total surface area of the flip chips 10 on one side of the package substrate 14 is as equal as possible to the total surface area of the flip chips 10 on the other side of the package substrate 14. Then the flip chips 10 on either side of the package substrate 14 are positioned so as to be substantially aligned to the flip chips 10 on the other side of the package substrate 14, either at their edges, centers, or combined centers, as described above.

Figure 7:
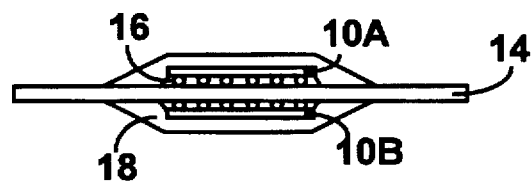
FIG. 7 is a cross-sectional view of a pair of flip chips which have been encapsulated with epoxy against a package substrate.
Figure 8:
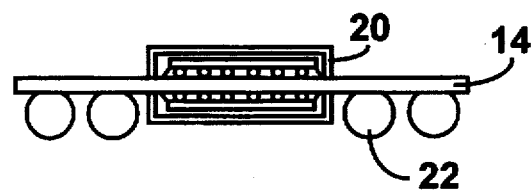
FIG. 8 is a cross-sectional view of a pair of flip chips which have been encapsulated with lids against a package substrate.

The flip chips on the package substrate 14, such as 10A and 10B, are under filled with a heat conductive epoxy 16, as depicted in FIG. 6, to aid in conducting heat away from each flip chip 10A and 10B, and to strengthen the attachment between the flip chips 10A and 10B and the package substrate 14. The flip chips 10A and 10B may be encapsulated against the package substrate 14, such as by heat conductive epoxy 18, as depicted in FIG. 7. Alternately, the flip chips 10A and 10B may be encapsulated by means of lids 20 which are attached to package substrate 14, and depicted in FIG. 8. Electrical connectors, such as solder balls 22, are attached to the package substrate 14 at the contact pads 15 (depicted in FIG. 3B), to provide for electrical connection to the flip chips 10A and 10B.

Several benefits are realized by attaching the integrated circuits 10 to opposite sides of the package substrate 14. By balancing the structure of the overall package, bending stress is reduced. This may be due to the symmetrical deployment of materials, integrated circuits 10, on both sides of the package substrate 14, which expand in response to temperature in a similar fashion, reducing warping of the package substrate 14. Because warping is reduced, thinner package substrates 14 may be used, allowing the overall package to be relatively smaller, lighter, and less expensive. In addition, by placing multiple integrated circuits 10 on a package substrate 14, a higher package density is realized, reducing the number of packages required to hold a given number of integrated circuits 10. Further, by placing the integrated circuits 10 in closer proximity one to another, the circuits are able to run at faster speeds.

While specific embodiments of the invention have been described with particularity above, it will be appreciated that the invention is equally applicable to numberless processes well known to those skilled in the art.

What is claimed is:

1. A method of assembling an integrated circuit in a package comprising:

providing a package substrate having first and second opposing sides, the first side having contact pads and first bonding pads, the second side having second bonding pads, and the substrate having electrical connections between at least one of the bonding pads and at least one of the contact pads, electrically connecting a first integrated circuit to the first bonding pads on the first side of the package substrate, the contact pads remaining accessible for electrical connection, and electrically connecting a second integrated circuit to the second bonding pads on the second side of the package substrate, where the position of the second integrated circuit is substantially opposed to and aligned with the position of the first integrated circuit.

2. The method of claim 1 wherein the first and second integrated circuits are flip chips, and are electrically connected to the package substrate by solder bumps.

3. The method of claim 2 further comprising the additional steps of:

under filling the first flip chip with a heat conductive epoxy, and under filling the second flip chip with a heat conductive epoxy.

4. The method of claim 1 further comprising the additional step of attaching solder balls to the contact pads on the first side of the package substrate.

5. The method of claim 1 further comprising the additional steps of:

encapsulating the first integrated circuit against the first side of the package substrate, and encapsulating the second integrated circuit against the second side of the package substrate.

6. A method of assembling flip chips in a package comprising:

attaching solder bumps to a first flip chip, attaching solder bumps to a second flip chip, providing a package substrate having first and second opposing sides, the first side having contact pads and first bonding pads, the second side having second bonding pads, and the substrate having electrical connections between at least one of the bonding pads and at least one of the contact pads, electrically connecting the first flip chip to the first bonding pads on the first side of the package substrate using the solder bumps attached to the first flip chip, the contact pads remaining accessible for electrical connection, electrically connecting the second flip chip to the second bonding pads on the second side of the package substrate using the solder bumps attached to the second flip chip, where the position of the second flip chip is substantially opposed to and aligned with the position of the first flip chip under filling the first flip chip with a heat conductive epoxy, under filling the second flip chip with a heat conductive epoxy, encapsulating the first flip chip against the first side of the package substrate, encapsulating the second flip chip against the second side of the package substrate, and attaching solder balls to the contact pads on the first side of the package substrate.

7. An electronic component comprising two flip chips electrically connected to a package substrate according to the method of claim 6.

8. A method of assembling integrated circuits in a package comprising:

providing a package substrate having first and second opposing sides, the first side having contact pads and bonding pads, the second side having bonding pads, and the substrate having electrical connections between at least one of the bonding pads and at least one of the contact pads, and electrically connecting at least one pair of integrated circuits to the package substrate, where the two integrated circuits in each pair are connected to the bonding pads on the opposing sides of the package substrate, the contact pads remaining accessible for electrical connection, and the position of one of the integrated circuits in a pair is substantially aligned with the position of the other of the integrated circuits in the pair.

9. The method of claim 8 wherein the integrated circuits are flip chips, and are electrically connected to the package substrate by solder bumps.

10. The method of claim 9 further comprising the additional step of under filling the flip chips with a heat conductive epoxy.

11. The method of claim 8 further comprising the additional step of attaching solder balls to the contact pads on the first side of the package substrate.

12. The method of claim 8 further comprising the additional step of encapsulating the integrated circuits against the sides of the package substrate.

13. An electronic component comprising at least one set of integrated circuits electronically connected to a package substrate according to the method of claim 8.

14. A method of assembling integrated circuits in a package comprising;

providing a package substrate having opposing first and second sides, the first side having contact pads and bonding pads, the second side having bonding pads, and the substrate having electrical connections between at least one of the bonding pads and at least one of the contact pads, and electrically connecting at least one integrated circuit to each side of the package substrate, the contact pads remaining accessible for electrical connection.

* * * * *